United States Patent [19]

Yueh

[11] 4,353,131
[45] Oct. 5, 1982

[54] TOUCH ACTUATED ELECTRONICALLY TUNED RECEIVER

[75] Inventor: Chang L. Yueh, Kokomo, Ind.

[73] Assignee: General Motors Corporation, Detroit, Mich.

[21] Appl. No.: 65,382

[22] Filed: Aug. 9, 1979

[51] Int. Cl.³ .............................................. H03J 7/28
[52] U.S. Cl. ..................................... 455/179; 455/161
[58] Field of Search ............... 455/179, 180, 183, 184, 455/154, 193, 166, 161, 167, 168, 169, 170, 175; 334/11; 307/222 R; 328/44, 46; 235/92 PE, 92 EV; 365/239

[56] References Cited

U.S. PATENT DOCUMENTS

| | | | |
|---|---|---|---|
| 3,924,106 | 12/1975 | Keefe | 235/92 EV |
| 3,924,191 | 12/1975 | Collins | 455/179 |
| 3,968,440 | 6/1976 | Ehni | 455/180 |
| 3,986,003 | 10/1976 | Pruessner | 235/92 EV |
| 4,008,436 | 2/1977 | Fujita | 455/165 |
| 4,048,570 | 9/1977 | Sumi | 455/180 |
| 4,087,793 | 5/1978 | Lucas | 455/179 |
| 4,198,605 | 4/1980 | Yamashita | 455/161 |

*Primary Examiner*—Tommy P. Chin
*Attorney, Agent, or Firm*—Albert F. Duke

[57] ABSTRACT

A receiver which may be tuned in a step, slow, or fast tuning mode through operator actuation of up and down tuning switches is disclosed. The counting direction of an up/down counter as well as its counting mode is determined by which of the status of the two switches. Control circuitry responds to the status of the switches to discretely increment or decrement the counter in response to momentary actuation of a switch. The counter is clocked at a slow rate if a switch is continuously actuated for a predetermined time interval and at a high rate if both switches are actuated concurrently.

5 Claims, 2 Drawing Figures

TOUCH ACTUATED ELECTRONICALLY TUNED RECEIVER

FIELD OF THE INVENTION

This invention relates to electronically tuned receivers and, more particularly, to an electronically tuned receiver which is controlled from discrete tuning switches.

BACKGROUND OF THE INVENTION

Electronically tuned receiver (ETR's) have been proposed which utilize manually actuable switches which cause the receiver to be tuned up or down the band. Digital circuitry responsive to actuation of these switches control electronic tuning circuitry which may include a varactor diode tuner. In general, the digital circuitry includes a reversible counter which counts up or down depending on which switch is actuated. The output of the counter may be converted to an analog voltage to control a varactor in the receiver tuning circuits, or converted to a digital code for insertion in the feedback divider of a frequency synthesizer.

It is an object of the present invention to provide digital control circuitry which is interposed between the tuning circuitry of an electronically tuned receiver and a pair of momentary contact switches to provide three different tuning functions.

SUMMARY OF THE INVENTION

In accordance with the present invention, control circuitry is provided which is responsive to selective actuation of up/down tuning switches or to concurrent operation in a particular sequence to provide three different tuning speeds, namely, step, slow and fast. By tapping one of the switches momentarily, the receiver is tuned up or down the band by a single channel depending on which switch is actuated. If either switch is maintained in an actuated position beyond a predetermined time interval, the receiver is continuously tuned in one direction at a constant relatively slow speed. If while the receiver is being tuned in this direction at the slow speed, the other switch is concurrently actuated, the receiver is then tuned at a constant relatively high speed in the same direction. These features permit the operator greater freedom in tuning to the desired portion of the band in the least amount of time.

A more complete understanding of the present invention may be had from the following detailed description which should be read in conjunction with the drawings, in which:

Figure 1:
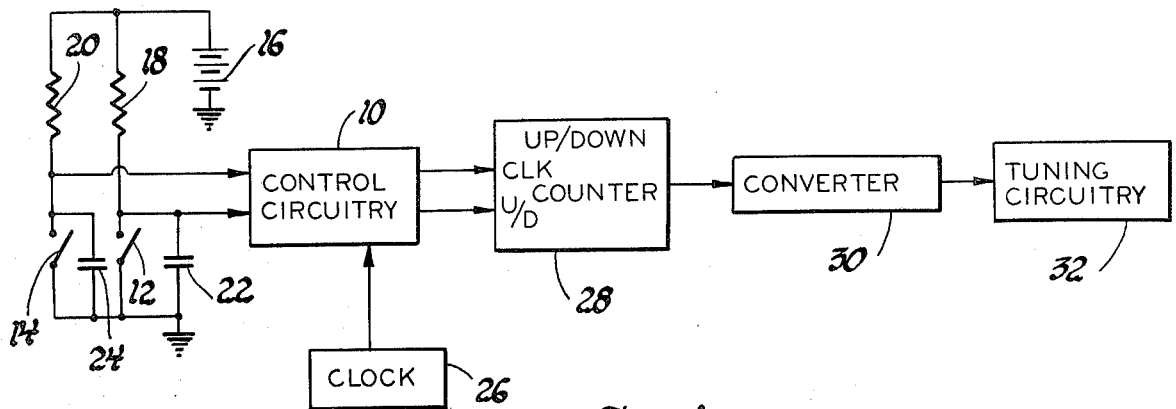
FIG. 1 is a block diagram of the present invention.

Referring now to the drawings and initially to FIG. 1, control circuitry generally designated 10 receives inputs from an UP switch 12 and a DOWN switch 14. The switches 12 and 14 have one side grounded while the other side is connected to a battery 16 through pull-up resistors 18 and 20. The capacitors 22 and 24 provide contact bounce protection. The other input to the circuitry 10 is from a clock generally designated 26. The circuitry 10 provides two outputs to an up/down binary counter 28, one of which clocks the counter and the other of which controls the counter direction. The control circuitry 10 and counter 28 form code generating means which provide a binary code for effecting tuning of a receiver. The output of the counter is fed to a converter 30 which supplies an input to tuning circuitry 32 or the receiver. Though not shown, indicator means responsive to the output of the counter 28 would normally be available to provide a visual feedback to the operator of the frequency to which the receiver is tuned. The converter 30 may be a D/A converter which supplies a tuning voltage to a varactor diode tuner or a code converter which converts the binary output of the counter 28 to a number which is inserted in the usual divider of a frequency synthesizer as is well-known in the art. The converter 30 and tuning circuitry 32 will not be described in detail since the present invention is not dependent on the particular configuration of these elements. Indeed, the converter 30 is optional in the sense that the tuning circuitry 32 may be designed to respond directly to the binary output of the counter 28 if such is desired.

Figure 2:
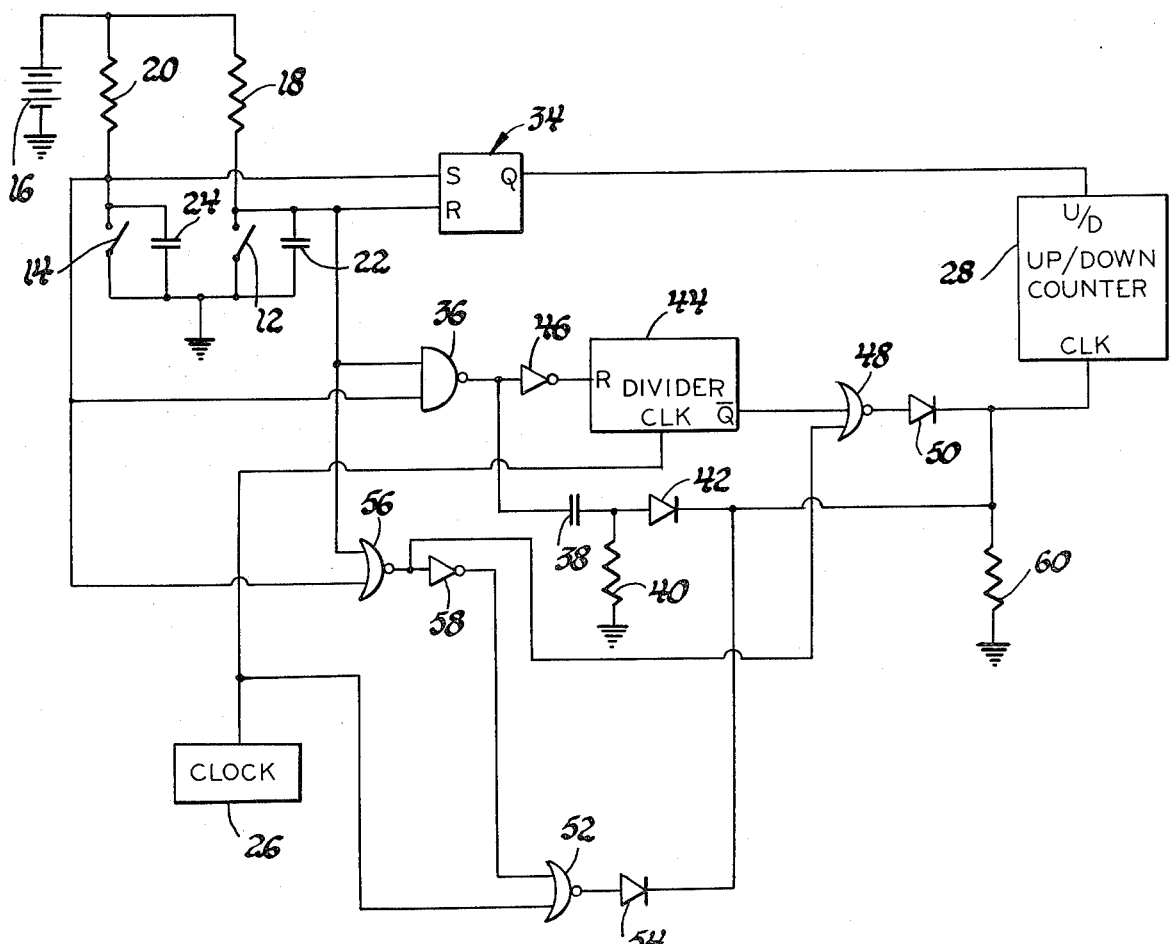
FIG. 2 is a more detailed logic diagram of the control circuitry of FIG. 1.

Referring now to FIG. 2, the control circuitry 10 comprises a latch 34, the Q output of which controls the counting direction of the counter 28. If the set input of the latch 34 is pulled low, the Q output goes low. If the reset input is pulled low, the Q output goes high. If both inputs are high, the Q output is high. If both inputs are low, there is no change in the Q output. The latch 34 is reset from the UP switch 12 and set from the DOWN switch 14. The switches 12 and 14 also provide inputs to a NAND gate 36, the output of which is connected with a discrete clock pulse generating network comprising a capacitor 38, resistor 40 and isolating diode 42. The output of the gate 36 is low when both switches 12 and 14 are open and switches high if either of the switches 12 or 14 is closed. When the output of the gate 36 switches high upon closure of one of the switches 12 or 14, the clock input to the counter 28 goes high momentarily until the capacitor 38 charges to a threshold value. This causes the counter 28 to be incremented if the Q output of latch 34 is high, or decremented if the Q output of latch 34 is low.

The output of the gate 36 is also applied to the reset terminal of a divider 44 through an inverter 46. The $\overline{Q}$ output of the divider 44 is applied as one input to a NOR gate 48, the output of which is applied to the clock input of the counter 28 through an isolating diode 50. The divider 44 may be a three-stage divider which produces at its output one pulse for every eight pulses of the clock 26. Whenever the switches 12 and 14 are both open, the divider 44 is reset. If either one of the switches 12 or 14 is closed, the reset on the divider 44 is released and after a time delay of eight clock pulses a pulse train of one-eighth the frequency of the clock 26 is applied to the gate 48. If during this time delay the actuated one of the switches 12 or 14 is deactuated, the divider 44 is reset requiring an additional eight clock pulses before an output appears. Thus, the divider performs a time delay function as well as a source of clocking pulses to the counter 28 of relatively low frequency in relation to the clock 26.

A relatively high rate of clocking pulses is provided to the counter 28 from the clock 26 through a NOR gate 52 and an isolating diode 54. The control input to the gate 52 is from a NOR gate 56 through an inverter 58. The switches 12 and 14 provide inputs to the gate 56 so that if the switches 12 and 14 are concurrently closed, the two low inputs to the gate 56 produce a low input to the gate 52 permitting the clock pulses from the clock 26 to pass through the gate 52 to the clock input of the counter 28.

The gate 48 is controlled from the output of the gate 56 and is thus enabled if either of the switches 12 or 14 is open and is disabled if both of the switches 12 and 14 are closed. Thus, if only one of the switches 12 or 14 is closed, the gate 48 is enabled from the gate 56 and the gate 52 is disabled. On the other hand, if both the switches 12 and 14 are closed, the gate 48 is disabled and the gate 52 is enabled. If both of the switches 12 and 14 are open, the gate 48 is enabled, however, the divider is maintained in a reset state so that the counter 28 is not clocked. The resistor 60 functions as a pull-down resistor maintaining the clock input of the counter 28 low in the absence of a clock signal.

In summary, the control circuitry 10 and counter 28 provide three tuning modes depending on the manner in which the switches 12 or 14 are actuated. By momentarily actuating one of the switches, the frequency to which the receiver is tuned discretely change, for example, by one channel. By maintaining the switch closed for the time interval established by the divider 44, the receiver is tuned up or down the band at a relatively slow rate with tuning being terminated when the switch is deactuated. If while the slow rate of tuning is in progress a faster rate is desired, the other switch can be actuated concurrently to initiate a higher rate of tuning, but in the same direction. It will be apparent from the logic that simultaneous actuation of the switches will initiate tuning at the high rate and in an up direction.

The embodiments of the invention in which an exclusive property or privilege is claimed are defined as follows:

1. A receiver including means for effecting tuning of the receiver in response to a binary code, first and second manually actuable switch means, code generating means for supplying said binary code, said code generating means responsive to actuation of said first switch means for less than a predetermined time interval for incrementing said code to a value representing the next higher channel, said code generating means responsive to actuation of said second switch means for less than said predetermined time interval for decrementing said code to a value representing the next lower channel, said code generating means responsive to continuous actuation of said first switch means for at least said predetermined time interval for thereafter incrementing said code at a first rate for the duration of actuation of said first switch means and responsive to actuation of said second switch means subsequent to actuation of said first switch means for incrementing said code at a second higher rate for the duration of concurrent actuation of said first and second switch means.

2. A receiver including means for effecting tuning of the receiver in response to a binary code, an up switch and a down switch, said switches being manually actuable for the purpose of respectively increasing and decreasing the frequency to which the receiver is tuned, code generating means responsive to actuation of said switches for developing said code, said code generating means including up/down counter means providing said code at the output thereof and including a direction control input and a clock input, said code generating means further including timing means providing a discrete clock signal, a relatively high frequency clock signal and a relatively low frequency clock signal, said code generating means further including bistable means responsive to said switches and adapted to be placed in one of its stable states in response to actuation of said up switch and in the other of its stable states in response to actuation of said down switch, the state of said bistable means being unaffected by actuation of one of said switches subsequent to, but concurrently with, actuation of the other of said switches, said bistable means controlling the direction input of said counter means, said code generating means further including gating means responsive to actuation of either one of said switches for applying said discrete clock signal to said clock input of said counter and responsive to actuation of either of said switches for a predetermined time interval for applying said relatively low frequency clock signal to the clock input of said counter and responsive to concurrent actuation of said switches for applying said relatively high frequency clock signal to the clock input of said counter.

3. A receiver including means for effecting tuning of the receiver in response to a binary code, an up switch and a down switch, said switches being manually actuable for the purpose of respectively increasing and decreasing the frequency to which the receiver is tuned, an up/down counter including a direction control input and a clock input and supplying said binary code at its output, bistable means having a set input responsive to one of said switches and a reset input responsive to the other of said switches and an output for controlling the direction input of said up/down counter, clock generating means providing a pulsating output at a predetermined frequency, frequency divider means responsive to the output of said clock means for providing a pulsating output at a lower frequency, first gate means responsive to the position of said switches for enabling said divider means if either of said switches is actuated and for disabling said divider means if both of said switches are deactuated, means responsive to said first gate means for providing a single pulse to said clock input of said counter in response to actuation of either of said switches, second gate means connecting the output of said divider to the clock input of said counter, third gate means connecting the output of said clock generator means to the clock input of said counter, fourth gate means responsive to the position of said switches for enabling said second gate means if only one of said switches is actuated and for disabling said second gate means and enabling said third gate means if both of said switches are actuated whereby said receiver may be tuned in either of two directions in discrete steps or continuously in either direction at either of two rates.

4. An electronically tuned receiver comprising first and second switch means for commanding tuning of the receiver from an existing channel position to another channel position, tuning control circuitry responsive to actuation of said first switch means for less than a predetermined interval of time for tuning said receiver up one channel, said control circuitry responsive to continuous actuation of said first switch means beyond said predetermined interval of time for tuning said receiver up additional channels at a first rate for the duration of said continuous actuation, said control circuitry responsive to actuation of said second switch means subsequent to actuation of said first switch means for tuning said receiver up at a second higher rate for the duration of concurrent actuation of said first and second switch means.

5. An electronically tuned receiver comprising an up switch and a down switch, counting means, means responsive to the content of said counting means for tuning said receiver, means responsive to actuation of said up or down switch for establishing an up or down counting direction respectively for said counting means, means providing high and low rate clock signals, said counting means responsive to momentary actuation of said up or down switches respectively to increment or decrement said count by one unit, gate means applying said low rate clock signals to said counting means in response to actuation of said up or down switches for greater than a predetermined time interval to continuously and respectively increment or decrement said count at a relatively low rate for the duration of actuation of the switch, said gate means applying said high rate clock signals to said counting means in response to concurrent actuation of said up and down switches to continuously increment or decrement said count in the direction established by the first actuated of the switches and at a relatively high rate for the duration of said concurrent actuation.

* * * * *